United States Patent [19]

Maruyama et al.

[11] Patent Number: 5,043,198

[45] Date of Patent: * Aug. 27, 1991

[54] LIGHTSAFE MASKING FILM

[75] Inventors: Hiroshi Maruyama, Misato; Naohiko Kiryu, Urawa; Etsuko Minezaki, Misato, all of Japan

[73] Assignee: Somar Corporation, Japan

[*] Notice: The portion of the term of this patent subsequent to May 8, 2007 has been disclaimed.

[21] Appl. No.: 305,130

[22] Filed: Feb. 2, 1989

[30] Foreign Application Priority Data

Apr. 18, 1988 [JP] Japan ................................ 63-97465

[51] Int. Cl.$^5$ ........................... B32B 5/16; B32B 7/06; B32B 19/02
[52] U.S. Cl. ........................................ 428/40; 428/220; 428/339; 428/326; 428/327; 428/331; 428/447; 428/521; 428/522
[58] Field of Search .................. 428/40, 42, 447, 326, 428/327, 343, 220, 331, 339, 521, 522

[56] References Cited

U.S. PATENT DOCUMENTS

| | | | |
|---|---|---|---|
| 3,892,900 | 7/1975 | Shima | 428/40 |
| 4,681,784 | 7/1987 | Ebara | 428/40 |
| 4,866,026 | 9/1989 | Henzel | 428/447 |
| 4,923,727 | 5/1990 | Maruyama et al. | 428/40 |

FOREIGN PATENT DOCUMENTS 0188292 of 1986 European Pat. Off. .

OTHER PUBLICATIONS

Japanese Patent Abstracts, vol. 13, No. 135 (P-851), Apr. 5, 1989.

Primary Examiner—Jenna Davis
Attorney, Agent, or Firm—Lorusso & Loud

[57] ABSTRACT

A lightsafe masking film is disclosed which comprises a substrate, and a peelable lightsafe layer provided over the surface of the substrate and including a binder, a lightsafe substance and at least one additive selected from a solid, organic filler and a liquid organopolysiloxane.

13 Claims, No Drawings

LIGHTSAFE MASKING FILM

This invention relates generally to a lightsafe masking film and, more specifically, to a composite, lightsafe masking flim to be used as an original copy having a transparent pattern in the photomechanical reproduction process.

A lightsafe masking film composed of a plastic film substrate and a peelable, lightsafe layer provided thereon is known. When a desired cutting line is formed on the lightsafe layer manually or with a suitable automatic cutting device and when the cut portion is removed by peeling, there is left a desired transparent pattern on the masking film. One known composition of such a lightsafe layer consists of a vinyl chloride/vinyl acetate copolymer, a nitrile rubber and a colorant. The known lightsafe layer, however, has a problem in its physical properties, such as adhesiveness between the substrate and the lightsafe layer, peelability of the lightsafe layer from the substrate, non-tackiness of the surface of the lightsafe layer and legibility of the cut lines.

The present invention has been made in view of the problems of the conventional masking film and provides a lightsafe masking film, comprising a substrate, and a peelable lightsafe layer provided over the surface of said substrate and including a binder, a lightsafe substance and at least one additive selected from a solid, organic filler and a liquid organopolysiloxane.

The present invention will now be described in detail below.

Lightsafe masking film according to the present invention is generally comprised of a transparent substrate formed of a plastic material having provided thereon a peelable, transparent, lightsafe layer.

Any plastic material conventionally used as a transparent substrate in known lightsafe masking films can be used for the purpose of the present invention. Synthetic resin films, semisynthetic resin films and laminated films thereof may be used as the substrate. Illustrative of suitable synthetic resin films are those formed of a polyester such as polyethylene terephthalate or polybutylene terephthalate, an aromatic polyamide, an aliphatic polyamide, a polyolefin such as polyethylene or polypropylene, a polystyrene, a polycarbonate, a polyvinyl chloride and a polyvinylidene chloride. Illustrative of a suitable semisynthetic resin film is that formed of a cellulose acetate. Examples of the laminated films include those using a combination of synthetic resin layers, a combination of synthetic resin and semisynthetic resin layers, a combination of a cellulose layer and a synthetic resin layer and/or a semisynthetic resin layer. Above all, a polyethylene terephalate film is an especially preferred substrate for reasons of excellent dimensional stability and excellent tensile strength and tearing strength. The thickness of the film is generally in the range of 20-300 μm, preferably 50-250 μm. Both stretched and non-stretched films may be used as the substrate.

The substrate is overlaid with a peelable, lightsafe layer generally composed of a binder, a lightsafe or light-shading substance and a specific additive. Any binder customarily used in lightsafe layer of known masking films may be used for the purpose of the present invention. Examples of the binder include a polyvinyl chloride, a polyvinylidene chloride, a polyvinyl acetate, a polyvinyl formal, a polyvinyl acetal (e.g. polyvinyl butylal), an acrylic resin, a polyamide resin, a polyacetal resin, a polyester resin, a phenol resin, a urea resin, a melamine resin, an alkyd resin, a polyurethane resin, a cellulose acetate resin, a polyvinyl alcohol, a copolymer of vinyl chloride (e.g. a vinyl chloride/vinyl acetate copolymer, a vinyl chloride/vinylidene chloride copolymer, a vinyl chloride/acrylic ester copolymer and a vinyl chloride/vinyl acetate/maleic acid copolymer), a copolymer of vinyl acetate (e.g. a vinyl acetate/ethylene copolymer), cellulose (e.g. nitrocellulose, acetyl cellulose, alkyl cellulose and acetylalkylcellulose), a diene-type rubber (e.g. an acrylonitrile/butadiene rubber), an olefin-type rubber (e.g. an acrylic rubber) and an urethane rubber. These binders may be used by themselves or in combination of two or more.

Above all, it is preferable to use as a binder a combination of a vinyl chloride/vinylidene chloride copolymer and a diene-type rubber or a combination of a vinyl chloride/vinyl acetate copolymer and a diene-type rubber.

One preferred copolymer of vinyl chloride and vinyl acetate is a terpolymer composed of 80-90% by weight of vinyl chloride, 8-15% by weight of vinyl acetate and 0.5-5% by weight of maleic acid and having a degree of polymerization of 350-450.

One preferred vinyl chloride/vinylidene chloride copolymer is one which has a vinyl chloride content of 60-95% by weight, more preferably 70-90% by weight, the balance being essentially vinylidene chloride. When the proportion of the vinylidene chloride exceeds 40% by weight, the resulting lightsafe layer becomes tacky. A proportion of the vinylidene chloride below 5% by weight is disadvantageous because the lightsafe layer becomes so rigid that it is apt to be cracked during peeling operation. The vinyl chloride/vinylidene chloride copolymer preferably has an average polymerization degree of 300-600, more preferably 400-500. Too high a polymerization degree in excess of 600 causes lowering of the solubility of the polymer so that it becomes difficult to prepare a coating liquid for the formation of the lightsafe layer. In addition, since the coating liquid becomes high in viscosity, it becomes difficult to form a uniformly coated lightsafe layer on the substrate. A polymerization degree of below 300 is also disadvantageous because the resulting lightsafe layer is weak and is apt to be broken during a peeling stage.

The nitrile rubber to be used in conjunction with the above copolymers is composed of butadiene and acrylonitrile as its main components. An acrylonitrile/butadiene rubber, an acrylonitrile/butadiene copolymer and a terpolymer of acrylonitrile/butadiene/carboxyl group-containing monomer are illustrative of such nitrile rubber. The acrylonitrile content of the nitrile rubber is preferably 18-53% by weight, more preferably 25-45% by weight. A nitrile rubber having a solubility constant ($\delta$s) of 9.0-10.4 and a Mooney viscosity of 25-90 is suitably used.

When the combination of a vinyl chloride/vinyl acetate/maleic acid terpolymer and a nitrile rubber is used as the binder, the weight ratio of the former to the latter is generally 50:50 to 90:10. When the weight ratio exceeds 90:10, the lightsafe layer becomes apt to be broken.

When the combination of a vinyl chloride/vinylidene chloride copolymer and a nitrile rubber is used as the binder, the weight ratio of the former to the latter is generally 50:50 to 95:5, preferably 60:40 to 90:10. Too low a weight ratio below 50:50 causes an excessive increase of the binding strength between the layer and the substrate, a decrease of rigidity of the layer, an increased tendency to deform and an increase of the surface tackiness. On the other hand, when the weight ratio exceeds 95:5, the binding force becomes small and the layer becomes apt to be broken.

The kind and color of the lightsafe substance to be incorporated into the lightsafe layer are not specifically limited as long as the resulting lightsafe layer can block light having a wavelength of 300–550 nm. Red, yellow or amber colorants of an oil-soluble type, a direct dye-type, a reaction-type or an acidic-type may be suitably used. Two or more colorants can be used in combination. Colorant soluble in an organic solvent is generally used for reasons of easiness of formation of the lightsafe layer on the substrate. The lightsafe substance is used in an amount so that the resulting lightsafe layer can block light having a wavelength of 300–550 nm.

The lightsafe layer should further contain one or more additives selected from solid, organic fillers and liquid organopolysiloxanes.

Advantages accruing from the use of the organic filler are as follows:

(1) Reflection of light on the surface of the lightsafe layer is suppressed so that the masking film hardly causes eye fatigue;
(2) The electrostatic charging is reduced;
(3) The surface becomes non-tacky so that there is caused no blocking when the masking films are allowed to stand in a superimposed or rolled state;
(4) Letters or patterns can be written on the surface of the lightsafe layer with pencils, ball-point pens and other writing instruments;
(5) Occurrence of halation when photographed can be prevented;
(6) Vacuum contact printing becomes easy to perform;
(7) Discrimitivity of the frontside from backside of the masking film is improved; and
(8) The lightsafe layer permits easy formation of cut lines without causing wearing of cutter knife edges.

Examples of suitable solid, organic fillers include a cross-linked polystyrene, a benzoguanamine-formaldehyde condensation product, a polyamide (e.g. 6,6-nylone, 6-nylone or 12-nylone), a silicone resin, a crystalline cellulose, a phenolformaldehyde resin, a fluororesin, a polyethylene resin or an acrylic resin. Of these fillers, the use of polystyrene beads is particularly preferred, because it is effective in improving homogeneity of a coating composition for the formation of the lightsafe layer, in improving peelability of the lightsafe layer from the substrate while maintaining desired bonding therebetween, in supressing reflection of light on the surface of the lightsafe layer, and in reducing the surface tackiness of the lightsafe layer.

The filler preferably has a particle size of 0.5–20 μm, more preferably 2–15 μm and is preferably used in an amount of 0.1–30%, more preferably 0.5–20% based on the weight of the binder.

Illustrative of suitable organopolysiloxane is a dimethylpolysiloxane, a methylethylpolysiloxane, a methylphenylpolysiloxane, a methylvinylpolysiloxane, a copolymer of dimethylpolysiloxane and an oxyalkylene or a polysiloxane modified with a higher alkyl. The organopolysiloxane is preferably used in an amount of 0.01–1.5% based on the weight of the binder.

Advantages accruing from the use of the organopolysiloxane are as follows:

(1) Adhesivity of the lightsafe layer to the substrate is improved without adversely affecting peelability;
(2) Thin portions of a pattern remaining after peeling can be maintained as such; and
(3) The surface of the lightsafe layer becomes smooth.

The lightsafe layer may be prepared by any known manner such as by applying a coating composition containing the above ingredients on the surface of the substrate. A solvent such as an alcohol, an ester, a hydrocarbon, a halogenated hydrocarbon, a ketone or the like organic solvent can be used for the formation of the coating composition. The lightsafe layer generally has a thickness of 10–50 μm, preferably 20–40 μm.

The lightsafe layer may be prepared by any known manner such as by applying a coating composition containing the above ingredients on the surface of the substrate. A solvent such as an alcohol, an ester, a hydrocarbon, a halogenated hydrocarbon, a ketone or the like organic solvent can be used for the formation of the coating composition. The coating composition may further contain a leveling agent, a blocking-preventing agent (such as inorganic, fine particulate filler such as synthetic silica) and a plasticizer, if desired. The lightsafe layer generally has a thickness of 10–50 μm, preferably 20–40 μm.

It is possible to provide a pressure sensitive adhesive layer between the substrate and the lightsafe layer so that the resulting masking film may permit the reuse of a cut lightsafe layer, peeled off from the substrate, for resticking. Such a adhesive layer is formed of a synthetic resin adhesive such as an acrylate ester copolymer, a saturated polyester or a polyurethane, or a rubber adhesive such as a natural rubber, a chloroprene rubber, isoprene rubber or a nitrile rubber.

The lightsafe masking film according to the present invention may be suitably used for the masking of a roomlight photosensitive material, such as of a silver halide-type or a photopolymer-type, which is sensitive to light with wavelengths of 400 nm or less.

The following examples will further illustrate the present invention. In the examples, "part" is by weight. The test methods and evaluation of the test results in the following examples are as follows:

(1) PEELABILITY

Lightsafe layer of sample masking film is cut with a cutter knife into square patterns and one of the squares is peeled off with fingers from its corner. Peelability is evaluated and rated as being good or bad.

(2) CAPABILITY OF RAISING UP

Sample masking film is cut in the same manner as (1) above and a corner of the square is raised with the cutter knife. Capability of raising is evaluated in terms of easiness of raising the corner and is rated as follows:
3: Easy to raise
2: Slightly difficult to raise
1: Difficult to raise (3) BONDING STRENGTH Using a surface property measuring machine HEIDON 14 (Shintoh Manufacturing K. K.), a force required for peeling off the lightsafe layer is measured.

(4) BLOCKING TENDENCY

Two masking films are superimposed with the substrate of the upper masking film contacting with the lightsafe layer of the lower masking film. The two films are then allowed to stand at a temperature of 25° C. and a relative humidity of 50% for 24 hours while applying a load of 30 kg/m² to the films. Tendency of the films to stick to each other at their contact is examined and is rated as follows:
3: No blocking
2: Blocking occurs partly
1: Blocking occurs entire area

(5) CRACKING TENDENCY

Tendency of lightsafe layer to crack during peeling is checked and is rated as follows:
3: No cracking
2: Partly cracsd
1: Easily cracks

(6) TENDENCY TO LENGTHEN

The degree of stretching of the lightsafe layer during peeling operation is evaluated and rated as follows:
5: Considerably lengthened
4: Fairly lengthened
3: Moderately lengthened
2: Slightly lengthened
1: Not at all lengthened

(7) SURFACE CONDITION

Whether the surface of the lightsafe layer is good (uniform) or bad (not uniform) is checked.

(8) STICKINESS

The surface of the lightsafe layer is touched to evaluate its stickiness:
Good: not sticky
Bad: sticky

(9) SMALL PATTERN RETENTIVITY

The lightsafe layer is cut to form circular patterns having diameters ranging from 0.5 to 5 mm and spaced apart with a distance of 1 mm. The remainder portion of the lightsafe layer is peeled off. The surface of the masking film having lightsafe circular patterns is rubbed. Easiness of the circular patterns to be peeled off is evaluated and rated as follows:
5: Not peeled off at all
4: A greater part of circular patterns remain unpeeled
3: About half of circular patterns remain unpeeled
2: A greater part of circular patterns are peeled off
1: All of the circular patterns are peeled off

EXAMPLE 1

A coating composition was obtained by homogeneously mixing 17 parts a vinyl chloride/vinylidene chloride copolymer (weight ratio of the former to the latter: 80/20 (wt/wt), average polymerization degree: 430), 4 parts of an acrylonitrile/butadiene copolymer (acrylonitirile content: 33% by weight), 2 parts of a metal complex dye (Valiozol Orange 3209T), 0.1 part of an organopolysiloxane (KP356, Shinetsu Kagaku K.K.) 0.5 part of a cross-linked polystyrene (average particle size: 6 μm) and 76.4 parts of methyl ethyl ketone. The coating composition was then uniformly applied over the surface of a polyethylene film (thickness: 75 μm) by a roll coater method and the coat was dried at 100° C. to obtain a masking film composed of the polyethylene film substrate having provided thereon a lightsafe layer with a thickness of 25 μm. The resulting masking film was then tested to obtain the results as summarized in Table 1 below.

EXAMPLE 2

Example 1 was repeated in the same manner as described except that synthetic silica (average particle size: 6 μm) was substituted for the cross-linked polystyrene. Test results for the resulting masking film are shown in Table 1.

EXAMPLE 3

Example 1 was repeated in the same manner as described except that the cross-linked polystyrene was not used. Test results for the resulting masking film are shown in Table 1.

TABLE 1

|  | Example 1 | Example 2 | Example 3 |
| --- | --- | --- | --- |
| Stability of coating composition | very good | good | poor |
| Blocking tendency | 3 | 3 | 2 |
| Ability to prevent light reflection | very good | very good | good |
| Ability to prevent electrostatic charging | very good | very good | good |
| Ability to prevent wearing of cutter knife | very good | poor | very good |
| Frontside/backside discrimitivity | good | good | poor |

EXAMPLES 4 and 5

Example 1 was repeated in the same manner as described except that the amounts of the vinyl chloride/vinylidene chloride copolymer and acrylonitrile/butadiene rubber were changed to 3 parts and 18 parts, respectively (Example 4) and 5 parts and 16 parts, respectively (Example 5). The test results of these masking films are summarized in Table 2 together with those of the masking film of Example 1. In Table 2, the abbreviations are as follows:
NBR: acrylonitrile/butadiene copolymer
VC/VDC: vinyl chloride/vinylidene chloride copolymer

TABLE 2

|  | Example | | |
| --- | --- | --- | --- |
|  | 1 | 4 | 5 |
| NBR | 4 | 3 | 5 |
| VC/VDC | 17 | 18 | 16 |
| Bonding strength (g/cm) | 100 | 70 | 130 |
| Blocking tendency | 3 (no blocking) | 3 (no blocking) | 2 (partly) |
| Capability of raise-up | 3 (easy) | 3 (easy) | 2 (slightly difficult) |
| Cracking tendency | 3 (no crack) | 2 (partly) | 3 (no crack) |

EXAMPLES 6–9

A coating composition was prepared by mixing 37.5 parts of a 20% solution of a nitrile rubber (acrylonitrile content 33% by weight) in methyl ethyl ketone, 70 parts of a 25% solution of a vinyl chloride/vinyl acetate/maleic acid terpolymer (monomer ratio: 86:13:1, polymerization degree: 300-450) in methyl ethyl ketone, 1.5 parts of a colorant, 0.2 part of fine particulate polyethylene, 3.9 parts of methyl ethyl ketone and a quantity (as shown in Table 3) of a 10% solution of dimethylpolysiloxane (viscosity at 25° C.: 40-50 cs) in methyl ethyl ketone. The coating composition was then uniformly applied over the surface of a polyethylene film (thickness: 75 μm) by a roll coater method and the coat was dried at 100° C. to obtain a masking film composed of the polyethylene film substrate having provided thereon a lightsafe layer with a thickness of 25 μm. The resulting masking films was then tested to obtain the results as summarized in Table 3 below, in which the amount of the dimethylpolysiloxane is indicated in terms of weight % based on the total weight of the nitrile rubber and the terpolymer.

TABLE 3

| | Example | | | |
|---|---|---|---|---|
| | 6 | 7 | 8 | 9 |
| Amount of siloxane | 0 | 0.2 | 0.4 | 0.8 |
| Bonding strength (g/cm) | 80 | 90 | 110 | 120 |
| Blocking tendency | 3 | 3 | 3 | 3 |
| Peelability | good | good | good | good |
| Cracking tendency | 3 | 3 | 3 | 3 |
| Tendency to lengthen | 3 | 3 | 3 | 3 |
| Small pattern retentivity | 2 | 3 | 3 | 4 |

EXAMPLES 10-12

A colorant, dimethylpolysiloxane and benzoguanamineformaldehyde condensation product or synthetic silica in amounts shown in Table 4 below were mixed with a binder solution containing 150 parts of a 20% solution of an acrylonitrilebutadiene rubber (acrylonitrile content 33% by weight, Mooney viscosity: 78, solubility constant: 9.68) in methyl ethyl ketone and 280 parts of a 25% solution of a vinyl chloride/vinyl acetate/maleic acid terpolymer (monomer ratio: 86:13:1) in methyl ethyl ketone to form three kinds of coating composition. Each coating composition was then uniformly applied over the surface of a polyethylene film (thickness: 75 μm) by a roll coater method and the coat was dried at 100° C. to obtain a masking film composed of the polyethylene film substrate having provided thereon a lightsafe layer with a thickness of 25 μm. The resulting masking films were then tested to obtain the results as summarized in Table 3 below, in which the amounts of the colorant, dimethylpolysiloxane, benzoguanamine-formaldehyde condensation product (referred to as BFCP) and synthetic silica are indicated in terms of weight % based on the weight of the binder (nitrile rubber and the terpolymer).

TABLE 4

| | Example | | |
|---|---|---|---|
| | Example 10 | Example 11 | Example 12 |
| Colorant | 9.2 | 9.3 | 9.2 |
| Dimethyl-polysiloxane | 0.28 | 0.27 | 0 |
| BFCP | 0.22 | 0 | 0.22 |

TABLE 4-continued

| | Example | | |
|---|---|---|---|
| | Example 10 | Example 11 | Example 12 |
| Synthetic silica | 0 | 3.3 | 0 |
| Surface condition | good | good | bad |
| Bonding strength | 150 | 138 | 94 |
| Peelability | good | good | good |
| Stickiness immediately after coating | good | good | good |
| after stood at 40° C. for 24 hours | good | good | good |
| Tendency to lengthen | 3 | 3 | 3 |

What is claimed is:

1. A lightsafe masking film, comprising a substrate, and a peelable lightsafe layer provided over the surface of said substrate and including a binder, a lightsafe substance which renders said lightsafe layer impervious to light of a wavelength within the range of 300-550 nm, at least one solid, organic filler and a liquid organopolysiloxane.

2. A masking film as set forth in claim 1, wherein said binder is at least one polymeric substance selected from a polyvinyl chloride, a polyvinylidene chloride, a polyvinyl acetate, a polyvinyl formal, a polyvinyl acetal, an acrylic resin, a polyamide resin, a polyacetal resin, a polyester resin, a phenol resin, a urea resin, a melamine resin, an alkyd resin, a polyurethane resin, a cellulose acetate resin, a polyvinyl alcohol, a copolymer of vinyl chloride, a copolymer of vinyl acetate, a cellulose, a diene-type rubber, an olefin-type rubber or an urethane rubber.

3. A masking film as set forth in claim 1, wherein said binder is a mixture of a vinyl chloride/vinylidene chloride copolymer or a vinyl chloride/vinyl acetate copolymer and a diene-type rubber.

4. A masking film as set forth in claim 3, wherein said diene-type rubber is an acrylonitrile/butadiene copolymer or a terpolymer of acrylonitrile/butadiene/a carboxyl group-containing copolymerizable monomer.

5. A masking film as set forth in claim 1, wherein said organic filler is a cross-linked polystyrene, a benzoguanamine-formaldehyde condensation product, a polyamide, a silicone resin, a crystalline cellulose, a phenol-formaldehyde resin, a fluororesin, a polyethylene resin or an acrylic resin.

6. A masking film as set forth in claim 1, wherein said organic filler has a particle size of 0.5-20 μm.

7. A masking film as set forth in claim 1, wherein said organic filler is used in an amount of 0.1-30% based on the weight of said binder.

8. A masking film as set forth in claim 1, wherein said organopolysiloxane is a dimethylpolysiloxane, a methylethylpolysiloxane, a methylphenylpolysiloxane, a methylvinylpolysiloxane, a copolymer of dimethylpolysiloxane and an oxyalkylene or a polysiloxane modified with an alkyl.

9. A masking film as set forth in claim 1, wherein said organopolysiloxane is used in an amount of 0.01-1.5% based on the weight of said binder.

10. A masking film as set forth in claim 1, wherein said binder is a mixture of an acrylonitrile/butadiene copolymer having an acrylonitrile content of 25-45% by weight and a vinyl chloride/vinyl acetate/maleic acid terpolymer.

11. A masking film as set forth in claim 10, wherein said organic filler is a benzoguanamine-formaldehyde condensation product.

12. A masking film as set forth in claim 1, wherein said binder is a mixture of an acrylonitrile/butadiene copolymer having an acrylonitrile content of 25-45% by weight and a vinyl chloride/vinyl acetate/maleic acid terpolymer, and wherein said lightsafe layer further contains a synthetic silica.

13. A masking film as set forth in claim 9, wherein said organic filler is cross-linked polystyrene beads and is used in an amount of 0.1-3% by weight based on the weight of said binder.

* * * * *

UNITED STATES PATENT AND TRADEMARK OFFICE
CERTIFICATE OF CORRECTION

PATENT NO. : 5,043,198
DATED : August 27, 1991
INVENTOR(S) : MARUYAMA et al It is certified that error appears in the above-identified patent and that said Letters Patent is hereby corrected as shown below:

On the title page, Item [30]

"Foreign Application Priority Data",

"Apr. 18, 1988" should read --Apr. 19, 1988--.

Signed and Sealed this

Thirtieth Day of March, 1993

*Attest:*

STEPHEN G. KUNIN

*Attesting Officer*      *Acting Commissioner of Patents and Trademarks*